United States Patent
Chen et al.

(10) Patent No.: US 9,071,254 B2
(45) Date of Patent: Jun. 30, 2015

(54) OSCILLATOR AND SELF-CALIBRATION METHOD THEREOF

(71) Applicant: Grace Semiconductor Manufacturing Corporation, Shanghai (CN)

(72) Inventors: Ada Chen, Shanghai (CN); Emir Yu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 21 days.

(21) Appl. No.: 14/032,925

(22) Filed: Sep. 20, 2013

(65) Prior Publication Data
US 2014/0176245 A1 Jun. 26, 2014

(30) Foreign Application Priority Data
Dec. 20, 2012 (CN) .......................... 2012 1 0559559

(51) Int. Cl.
*H03L 7/093* (2006.01)
*H03L 7/16* (2006.01)

(52) U.S. Cl.
CPC . *H03L 7/16* (2013.01); *H03L 7/093* (2013.01)

(58) Field of Classification Search
CPC ............ H03L 7/00; H03L 7/08; H03L 7/085; H03L 7/093; H03L 7/16
USPC ................. 327/155, 156; 331/16–18, 44, 143
See application file for complete search history.

(56) References Cited

U.S. PATENT DOCUMENTS

| | | | | |
|---|---|---|---|---|
| 5,786,733 A * | 7/1998 | Yamaguchi | ..................... | 331/11 |
| 5,949,281 A * | 9/1999 | Sharpe | ......................... | 329/325 |
| 6,643,347 B2 * | 11/2003 | Ohishi | .......................... | 375/376 |
| 6,747,519 B2 * | 6/2004 | Jaehne et al. | ................... | 331/16 |
| 7,049,866 B2 * | 5/2006 | Wilson | .......................... | 327/157 |
| 7,133,485 B1 * | 11/2006 | Baird et al. | ..................... | 375/376 |
| 7,940,129 B1 * | 5/2011 | Tsang et al. | .................... | 331/17 |
| 8,010,072 B1 * | 8/2011 | Nathawad | ..................... | 455/260 |
| 8,140,040 B1 * | 3/2012 | Leon | ............................. | 455/260 |
| 8,179,174 B2 * | 5/2012 | Bunch | ........................... | 327/156 |
| 8,274,339 B2 * | 9/2012 | Fan et al. | ........................ | 331/176 |
| 8,421,542 B2 * | 4/2013 | Romano et al. | ................. | 331/17 |
| 2009/0219100 A1 * | 9/2009 | Pullela et al. | ................... | 331/44 |

* cited by examiner

*Primary Examiner* — Levi Gannon
(74) *Attorney, Agent, or Firm* — Harness, Dickey & Pierce, P.L.C.

(57) ABSTRACT

An oscillator and a self-calibration method thereof are provided. The oscillator includes: an oscillation unit for generating an oscillation signal; a converting unit for converting frequency of the oscillation signal into a voltage signal; a comparison unit for comparing the voltage signal with a first voltage corresponding to a higher frequency and a second voltage corresponding to a lower frequency, and outputting a comparison result signal; an adjusting unit for storing a calibration value, adjusting the calibration value based on the comparison result signal and outputting a calibration signal corresponding to the adjusted calibration value; and a calibration unit for calibrating the frequency of the oscillation signal based on the calibration signal. Self-calibration for the frequency of the oscillation signal may be achieved, which may ensure the stability of the frequency of the oscillation signal.

11 Claims, 2 Drawing Sheets

OSCILLATOR AND SELF-CALIBRATION METHOD THEREOF

CROSS REFERENCE TO RELATED APPLICATIONS

The present application claims priority to Chinese Patent Application No. 201210559559.9, filed on Dec. 20, 2012 and entitled "OSCILLATOR AND SELF-CALIBRATION METHOD THEREOF", the entire disclosure of which is incorporated herein by reference.

FIELD OF THE DISCLOSURE

The present disclosure generally relates to the field of integrated circuit, and more particularly, to an oscillator and a self-calibration method thereof.

BACKGROUND OF THE DISCLOSURE

Clock signals are essential elements in large-scale digital integrated circuits. In these digital systematic circuits, normally there are three kinds of clock signal generation circuits: RC (resistance-capacitance) oscillators, ring oscillators and crystal oscillators. Ring oscillators have a wide range of oscillation frequency and relatively high stability, but have less resistance to power supply noises and may occupy relatively large layout areas. Crystal oscillators have an accurate oscillation frequency and may work stably since the precision thereof may only be related to the intrinsic frequency of selected crystal components. However, crystal oscillators have drawbacks like larger power consumption, higher price. Besides, it is difficult for a crystal oscillator to be integrated in a chip. RC oscillators, due to their characteristics like simple structure, lower power consumption, low cost, convenience for being integrated, and the like, are widely used in oscillation circuits of integrated circuits.

However, output frequency of RC oscillators may be greatly influenced by work voltages and environmental temperatures. Besides, characteristics of RC oscillators may be highly related to manufacturing processes. For example, due to the limitations of semiconductor manufacturing, oscillators formed at different positions of a same wafer may have disparity in oscillation frequencies. Therefore, conventional oscillators may need to be calibrated to output more precise frequencies.

BRIEF SUMMARY OF THE INVENTION

According to an embodiment of the present disclosure, an oscillator is provided, including: an oscillation unit for generating an oscillation signal; a converting unit for converting frequency of the oscillation signal into a voltage signal; a comparison unit for comparing the voltage signal with a first voltage corresponding to a higher frequency and a second voltage corresponding to a lower frequency, and outputting a comparison result signal; an adjusting unit for storing a calibration value, adjusting the calibration value based on the comparison result signal and outputting a calibration signal corresponding to the adjusted calibration value; and a calibration unit for calibrating the frequency of the oscillation signal based on the calibration signal. The higher frequency and the lower frequency may set an acceptable range of frequency variation of the oscillator.

Optionally, the comparison unit is configured to: output a first comparison result signal if the voltage signal is lower than the second voltage, output a second comparison result signal if the voltage signal is higher than the second voltage and lower than the first voltage, and output a third comparison result signal if the voltage signal is higher than the first voltage.

Optionally, the adjusting unit is configured to: add 1 to the calibration value if the comparison unit outputs the first comparison result signal, keep the calibration value unchanged if the comparison unit outputs the second comparison result signal, and subtract 1 from the calibration value if the comparison unit outputs the third comparison result signal.

Optionally, the oscillator further includes a control unit for generating a time window for calibration and a latch unit for latching the calibration signal. Accordingly, the calibration unit is configured to: determine whether there is a time window for calibration, and if yes, calibrate the frequency of the oscillation signal based on the calibration signal. If there is no time window for calibration, the latch unit latches the calibration signal.

Optionally, the control unit is a pulse counter which generates the time window for calibration by counting the number of the oscillation signal.

Optionally, the converting unit includes a frequency-to-digital converting unit for converting the frequency of the oscillation signal into a digital signal, and a digital-to-analogue converting unit for converting the digital signal into the voltage signal.

Optionally, the comparison unit includes: a first operational amplifier, a second operational amplifier and a first inverter, where positive terminals of the first and second operational amplifiers are coupled to the voltage signal, a negative terminal of the first operational amplifier is coupled to the first voltage, a negative terminal of the second operational amplifier is coupled to the second voltage, an output terminal of the second operational amplifier is coupled to an input terminal of the first inverter, and the comparison result signal is outputted based on signals from output terminals of the first operational amplifier and the first inverter.

A self-calibration method for an oscillator is provided according to one embodiment of the present disclosure, including: generating an oscillation signal; converting frequency of the oscillation signal into a voltage signal; comparing the voltage signal with a first voltage corresponding to a higher frequency and a second voltage corresponding to a lower frequency, and outputting a comparison result signal; adjusting a calibration value based on the comparison result signal and outputting a calibration signal corresponding to the adjusted calibration value; and calibrating the frequency of the oscillation signal based on the calibration signal.

Optionally, comparing the voltage signal with the first voltage and the second voltage, and outputting the comparison result signal includes: outputting a first comparison result signal if the voltage signal is lower than the second voltage, outputting a second comparison result signal if the voltage signal is higher than the second voltage and lower than the first voltage, and outputting a third comparison result signal if the voltage signal is higher than the first voltage.

Optionally, adjusting the calibration value based on the comparison result signal includes: adding 1 to the calibration value if the comparison unit outputs the first comparison result signal, keeping the calibration value unchanged if the comparison unit outputs the second comparison result signal, and subtracting 1 from the calibration value if the comparison unit outputs the third comparison result signal.

Optionally, the method further includes determining whether there is a time window for calibration before calibrating the frequency of the oscillation signal based on the calibration signal, if yes, calibrating the frequency of the oscillation signal based on the calibration signal, and if no, latching the calibration signal.

Optionally, the time window for calibration is generated by counting the number of the oscillation signal.

Optionally, converting the frequency of the oscillation signal into the voltage signal includes: converting the frequency of the oscillation signal into a digital signal; and converting the digital signal into the voltage signal.

Compared with conventional techniques, the oscillator provided in embodiments of the present disclosure may have a more accurate and stable output. Specifically, the converting unit may convert the oscillation signal generated by the oscillation unit into the voltage signal based on the frequency of the oscillation signal. The voltage signal may be compared by the comparison unit with the first and second voltages respectively corresponding to two ends of an acceptable variation range of the output frequency of the oscillator. The comparison unit may output the comparison result signal based on which the adjusting unit may adjust the calibration value and output the calibration signal. The calibration unit may calibrate the frequency of the oscillation signal based on the calibration signal. In such way, a self-calibration may be implemented, which may keep the frequency of the output oscillation signal more accurate and stable.

Further, the oscillator may include the control unit and the latch unit. The control unit may generate the time window for calibration by counting the number of the oscillation signal generated by the oscillation unit. Within the time window, the calibration unit may calibrate the frequency of the oscillation signal based on the calibration signal. Out of the time window, the latch unit may latch the calibration signal and the calibration unit may suspend calibrating the frequency of the oscillation signal. Therefore, periodic checks and calibrations of the frequency of the oscillation signals can be achieved.

DETAILED DESCRIPTION OF THE INVENTION

Signal frequencies outputted from conventional oscillators are likely to change with work voltages, environmental temperatures and manufacturing processes, and thus are unstable. Therefore, calibrations for oscillation frequencies are required to obtain stable output frequencies.

Figure 1:
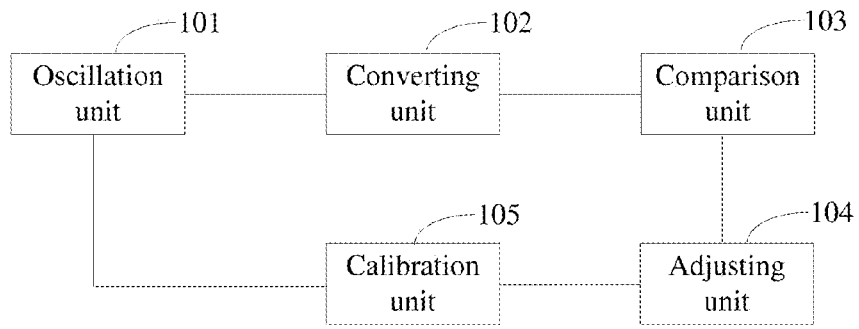
FIG. 1 schematically illustrates an oscillator according to one embodiment of the present disclosure.

Referring to FIG. 1, an oscillator is provided according to one embodiment of the present disclosure. The oscillator may include: an oscillation unit 101 for generating an oscillation signal; a converting unit 102 for converting the oscillation signal into a voltage signal based on a frequency of the oscillation signal; a comparison unit 103 for comparing the voltage signal with a first voltage corresponding to a higher frequency and a second voltage corresponding to a lower frequency, and outputting a comparison result signal; an adjusting unit 104 for storing a calibration value, adjusting the calibration value based on the comparison result signal, and outputting a calibration signal corresponding to the adjusted calibration value; and a calibration unit 105 for calibrating the frequency of the oscillation signal based on the calibration signal.

The frequency of the oscillation signal may drift due to the changes of work voltage and environmental temperature during working. In the oscillator in the embodiment described above, the converting unit 102 may convert the oscillation signal generated by the oscillation unit 101 into the voltage signal based on the frequency of the oscillation signal. The voltage signal may be compared by the comparison unit 103 with the first and second voltages respectively corresponding to the higher voltage and the lower voltage. The higher voltage and the lower voltage may set two ends of an acceptable variation range of the output frequency of the oscillator. The comparison unit 103 may output the comparison result signal based on which the adjusting unit 104 may adjust the calibration value and output the calibration signal corresponding to the adjusted calibration value. The calibration unit 105 may calibrate the frequency of the oscillation signal based on the calibration signal. In such way, a self-calibration may be implemented, which may keep the frequency of the output oscillation signal more accurate and stable.

Figure 2:
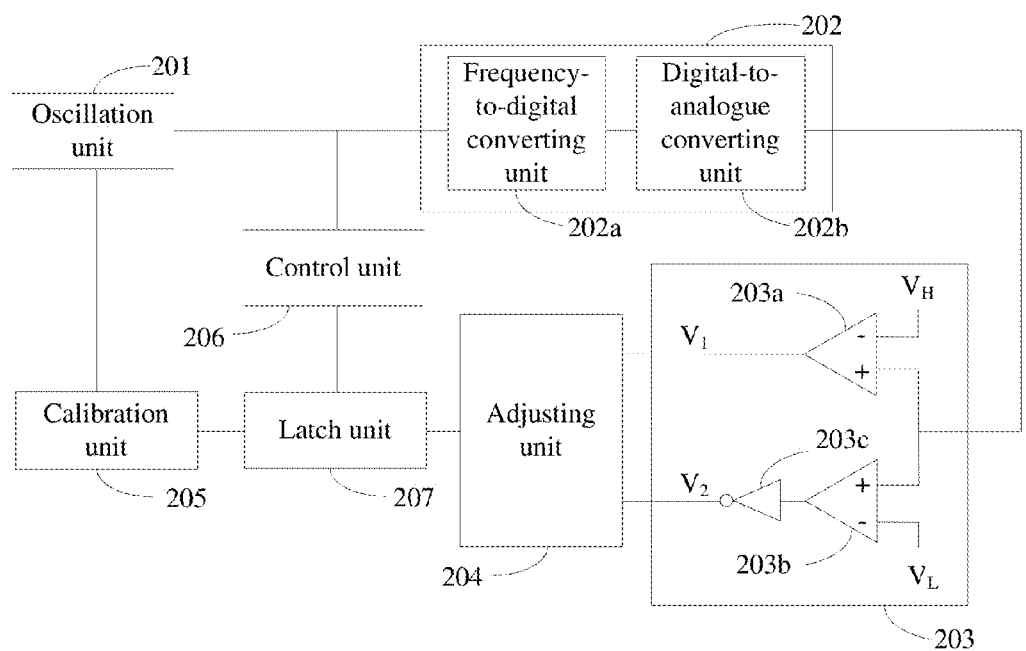
FIG. 2 schematically illustrates an oscillator according to one example embodiment of the present disclosure.

Specific embodiments of the present disclosure will be illustrated in detail with reference to accompanying drawings. FIG. 2 schematically illustrates an oscillator according to one example embodiment of the present disclosure. The oscillator includes: an oscillation unit 201, a converting unit 202, a comparison unit 203, an adjusting unit 204, a calibration unit 205, a control unit 206 and a latch unit 207.

The oscillation unit 201 is used to generate oscillation signals.

In some embodiments, the oscillation unit 201 may be a RC oscillator which is basically an oscillation circuit including a capacitance and a resistance. Oscillation signals are generated through interconversions between electric field energy and magnetic field energy, so that DC signals can be converted into AC oscillation signals. However, the frequency of the signal outputted by the RC oscillator may be greatly influenced by work voltage and environmental temperature, and thus is unstable. Therefore, calibration is needed.

The converting unit 202 is used to convert an oscillation signal generated by the oscillation unit 201 into a voltage signal based on the frequency f the oscillation signal.

To calibrate the frequency of the oscillation signal, the oscillation signal may need to be converted into a voltage or current signal corresponding to its frequency. The voltage or current signal may be compared with a voltage or current corresponding to a standard frequency to determine whether a drift of the frequency of the oscillation signal occurs. In some embodiments, the converting unit 202 may include a frequency-to-digital unit 202a for converting the oscillation signal into a digital signal based on the frequency of the oscillation signal, and a digital-to-analogue unit 202b for converting the digital signal into the voltage signal. Thereafter, the comparison unit 203 may compare the voltage signal obtained by the converting unit 202 with reference voltages, such that whether a drift of the frequency of the oscillation signal occurs may be determined.

The comparison unit 203 is used to compare the voltage signal with a first voltage $V_H$ corresponding to a higher frequency and a second voltage $V_L$ corresponding to a lower frequency, and output a comparison result signal.

The higher voltage and the lower voltage are predefined voltage values, which may decide an acceptable variation range of the frequency of the oscillation signal. The higher voltage is higher than the lower voltage. If the frequency of the oscillation signal drifts, due to changes of the work voltage or the environmental temperature, out of the acceptable variation range between the higher voltage and the lower voltage, a calibration may be performed to the frequency of the oscillation signal.

Specifically, the comparison unit 203 may be configured to: if the voltage signal is lower than the second voltage $V_L$, output a first comparison result signal; if the voltage signal is lower than the first voltage $V_H$ and higher than the second voltage $V_L$, output a second comparison result signal; and if the voltage signal is higher than the first voltage $V_H$, output a third comparison result signal.

In some embodiments, the comparison unit 203 may include: a first operational amplifier 203a, a second operational amplifier 203b and a first inverter 203c. A positive terminal of the first operational amplifier 203a and a positive terminal of the second operational amplifier 203b may be coupled to the voltage signal outputted by the converting unit 202. A negative terminal of the first operational amplifier 203a may be coupled to the first voltage $V_H$. A negative terminal of the second operational amplifier 203b may be coupled to the second voltage $V_L$. An output terminal of the second operational amplifier 203b may be coupled to an input terminal of the first inverter 203c. Comparison results $V_1$ and $V_2$ may be outputted from an output terminal of the first operational amplifier 203a and an output terminal of the first inverter 203c, respectively.

After the voltage signal outputted from the converting unit 202 is inputted to the comparison unit 203 and compared with the first voltage and the second voltage, the comparison results $V_1$ and $V_2$ may be configured as follows. If the voltage signal is lower than the second voltage $V_L$, the first operational amplifier 203a may output a comparison result $V_1=0$, and the first inverter 203a may output a comparison result $V_2=1$, corresponding to the first comparison result signal. If the voltage signal is lower than the first voltage $V_H$ and higher than the second voltage $V_L$, the first operational amplifier 203a may output a comparison result $V_1=0$, and the first inverter 203c may output a comparison result $V_2=0$, corresponding to the second comparison result signal. If the voltage signal is higher than the first voltage $V_H$, the first operational amplifier 203a may output a comparison result $V_1=1$, and the first inverter 203c may output a comparison result $V_2=0$, corresponding to the third comparison result signal.

The adjusting unit 204 is used to store a calibration value, adjust the calibration value based on the comparison result signal outputted by the comparison unit 203, and output a calibration signal based on the adjusted calibration value.

The calibration value may be a binary numerical value which may have 4 bits, 8 bits, 16 bits or the like. The number of the bits may be adjusted based on the calibration precision required by the oscillator. An initial value of the calibration value may be set when the oscillator is initialized and may be corresponding to the predetermined oscillation frequency of the oscillator. Specifically, the adjusting unit 204 may be configured to: add 1 to the calibration value if the comparison unit 203 outputs the first comparison result signal, keep the calibration value unchanged if the comparison unit 203 outputs the second comparison result signal, and subtract 1 from the calibration value if the comparison unit 203 outputs the third comparison result signal.

In some embodiments, the adjusting unit 204 may be an add-subtract counter which may be inputted with the comparison results $V_1$ and $V_2$ outputted by the comparison unit 203, and adjust the calibration value based on the values of $V_1$ and $V_2$. Specifically, if the comparison result outputted by the first operational amplifier 203a is $V_1=0$, and the comparison result outputted by the first inverter 203c is $V_2=1$, the adjusting unit 204 may add 1 to the calibration value. If the comparison result outputted by the first operational amplifier 203a is $V_1=0$, and the comparison result outputted by the first inverter 203c is $V_2=0$, the adjusting unit 204 may keep the calibration value unchanged. If the comparison result outputted by the first operational amplifier 203a is $V_1=1$, and the comparison result outputted by the first inverter 203c is $V_2=0$, the adjusting unit 204 may subtract 1 from the calibration value.

The calibration unit 205 is used to calibrate the frequency of the oscillation signal based on the calibration signal outputted by the adjusting unit 204.

The calibration unit 205 may feed the calibration signal obtained from the adjusting unit 204 back to the oscillation unit 201 to calibrate the frequency of the oscillation signal. In the RC oscillator, adjusting the frequency of the oscillation signal may be implemented by changing charging and discharging currents of the capacitance. The charging and discharging currents are controlled by charging and discharging power supplies which are controlled by a plurality of switches. Turning on and turning off the switches may influence the currents injected into the capacitance, thereby altering the frequency of the oscillation signal.

In some embodiments, the calibration value may be a binary numerical value, i.e., each bit thereof may be 0 or 1. The calibration unit 204 may control the switches in the oscillation unit 201 to be turned on or turned off based on the calibration value corresponding to the calibration signal. That is to say, the bits 0 and 1 in the calibration value may correspond to the switches, and changes of the calibration value may turn on or turn off corresponding switches. Therefore, the charging and discharging currents may be changed and thus the frequency of the oscillation signal may be calibrated.

The oscillator further includes the control unit 206 and the latch unit 207. The control unit 206 is used to generate a time window for calibration. The latch unit 207 is used to latch the calibration signal. The calibration unit 206 may be configured to: determine whether there is a time window for calibration, and if yes, calibrate the frequency of the oscillation signal based on the calibration signal. If there is no time window for calibration, the latch unit 207 may latch the calibration signal, and the calibration unit 206 may suspend calibrating the frequency of the oscillation signal.

In some embodiments, an input terminal of the control unit 206 may be coupled to an output terminal of the oscillation unit 201, an output terminal of the control unit 206 may be coupled to the latch unit 207, so as to transmit a latch signal to the latch unit 207. An input terminal of the latch unit 207 may be coupled to an output terminal of the adjusting unit 204, and an output terminal of the latch unit 207 may be coupled to an input terminal of the calibration unit 205. The control unit 206 may be a pulse counter which generates the time window for calibration by counting the number of oscillation signal. When the number of the oscillation signal reaches a predefined number, the time window is generated. Therefore, the time point and frequency of the generations of the time windows can be controlled by adjusting the predefined number. The latch unit 207 may be a latch. In the latch, the state of the output terminal would not change with the state of the input terminal, unless a latch signal is valid. When the latch signal is valid, the state of the input terminal would be stored into the output terminal and would not change until a next latch signal is received. During the time window of calibration, the control unit 206 may generate a latch signal, and accordingly, the latch unit 207 may transmit the calibration signal outputted by the adjusting unit 204 into the calibration unit 205. Therefore, the frequency of the oscillation signal generated by the oscillation unit 201 may be calibrated. Out of the time window, the state of the output terminal may not change, so that the calibration signal may be latched, and the calibration unit 205 may suspend working.

The control unit 206 may generate the time window for calibration by counting the number of the oscillation signal generated by the oscillation unit 201. Within the time window, the calibration unit 205 may calibrate the frequency of the oscillation signal based on the calibration signal. Out of the time window, the latch unit 207 may latch the calibration signal and the calibration unit 205 may suspend calibrating the frequency of the oscillation signal. Therefore, periodic checks and calibrations of the frequency of the oscillation signals can be achieved.

Figure 3:
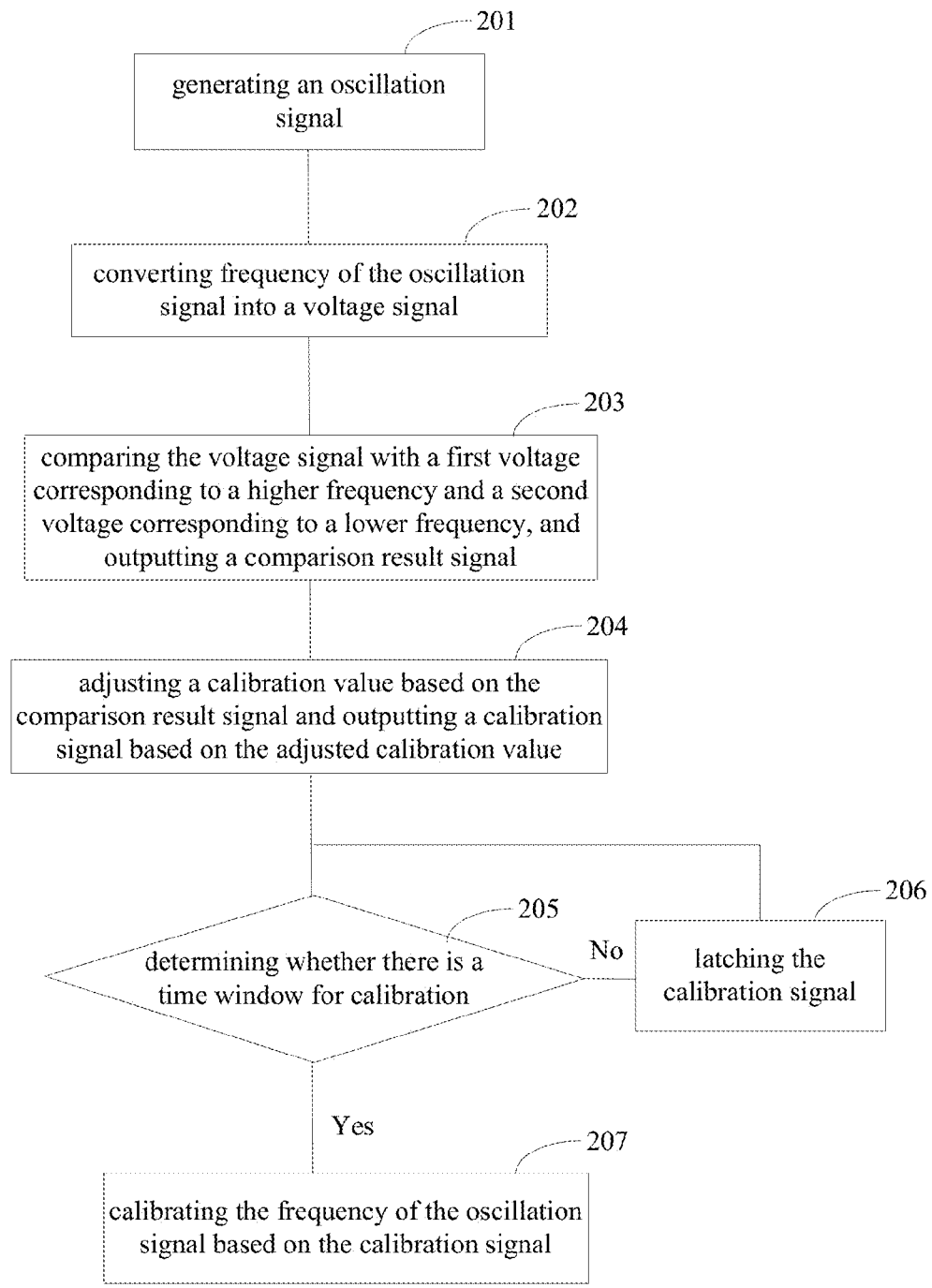
FIG. 3 schematically illustrates a flow chart of a self-calibration method for an oscillator according to one embodiment of the present disclosure.

A self-calibration method for an oscillator is provided according to one embodiment of the present disclosure. Referring to FIG. 3, the method include following steps.

In S201, generating an oscillation signal.

In S202, converting the oscillation signal into a voltage signal based on a frequency of the oscillation signal. Converting the oscillation signal into the voltage signal based on the frequency of the oscillation signal may include: converting the oscillation signal into a digital signal based on the frequency of the oscillation signal; and converting the digital signal into the voltage signal.

In S203, comparing the voltage signal with a first voltage corresponding to a higher frequency and a second voltage corresponding to a lower frequency, and outputting a comparison result signal. Comparing the voltage signal with the first voltage and the second voltage, and outputting the comparison result signal may include: outputting a first comparison result signal if the voltage signal is lower than the second voltage, outputting a second comparison result signal if the voltage signal is higher than the second voltage and lower than the first voltage, and outputting a third comparison result signal if the voltage signal is higher than the first voltage.

In S204, adjusting a calibration value based on the comparison result signal and outputting a calibration signal based on the adjusted calibration value. Adjusting the calibration value based on the comparison result signal may include: adding 1 to the calibration value if the comparison unit outputs the first comparison result signal, keeping the calibration value unchanged if the comparison unit outputs the second comparison result signal, and subtracting 1 from the calibration value if the comparison unit outputs the third comparison result signal.

In S205, determining whether there is a time window for calibration. If yes, goes to S207, if no, goes to S206.

In S206, latching the calibration signal and going back to S205.

In S207, calibrating the frequency of the oscillation signal based on the calibration signal.

The invention is disclosed, but not limited, by preferred embodiments as above. Based on the disclosure of the invention, those skilled in the art can make any variation and modification without departing from the scope of the invention. Therefore, any simple modification, variation and polishing based on the embodiments described herein is within the scope of the present invention.

What is claimed is:

1. An oscillator, comprising:
    an oscillation unit for generating an oscillation signal;
    a converting unit for converting frequency of the oscillation signal into a voltage signal;
    a comparison unit for comparing the voltage signal with a first voltage corresponding to a higher frequency and a second voltage corresponding to a lower frequency, and outputting a comparison result signal;
    an adjusting unit for storing a calibration value, adjusting the calibration value based on the comparison result signal and outputting a calibration signal corresponding to the adjusted calibration value;
    a calibration unit for calibrating the frequency of the oscillation signal based on the calibration signal;
    a control unit for generating a time window for calibration; and
    a latch unit for latching the calibration signal, wherein the calibration unit is configured to determine whether there is a time window for calibration, and if yes, the calibration unit calibrates the frequency of the oscillation signal based on the calibration signal, and if not, the latch unit latches the calibration signal.

2. The oscillator according to claim 1, wherein the comparison unit is configured to: output a first comparison result signal if the voltage signal is lower than the second voltage, output a second comparison result signal if the voltage signal is higher than the second voltage and lower than the first voltage, and output a third comparison result signal if the voltage signal is higher than the first voltage.

3. The oscillator according to claim 2, wherein the adjusting unit is configured to: add 1 to the calibration value if the comparison unit outputs the first comparison result signal, keep the calibration value unchanged if the comparison unit outputs the second comparison result signal, and subtract 1 from the calibration value if the comparison unit outputs the third comparison result signal.

4. The oscillator according to claim 1, wherein the control unit is a pulse counter which generates the time window for calibration by counting the number of the oscillation signal.

5. The oscillator according to claim 1, wherein the converting unit comprises a frequency-to-digital converting unit for converting the oscillation signal into a digital signal based on the frequency of the oscillation signal, and a digital-to-analogue converting unit for converting the digital signal into the voltage signal.

6. The oscillator according to claim 1, wherein the comparison unit comprises: a first operational amplifier, a second operational amplifier and a first inverter, where positive terminals of the first and second operational amplifiers are coupled to the voltage signal, a negative terminal of the first operational amplifier is coupled to the first voltage, a negative terminal of the second operational amplifier is coupled to the second voltage, an output terminal of the second operational amplifier is coupled to an input terminal of the first inverter, and the comparison result signal is outputted based on signals from output terminals of the first operational amplifier and the first inverter.

7. A self-calibration method for an oscillator, comprising:
    generating an oscillation signal;
    converting frequency of the oscillation signal into a voltage signal;
    comparing the voltage signal with a first voltage corresponding to a higher frequency and a second voltage corresponding to a lower frequency, and outputting a comparison result signal;
    adjusting a calibration value based on the comparison result signal and outputting a calibration signal corresponding to the adjusted calibration value;
    calibrating the frequency of the oscillation signal based on the calibration signal; and
    determining whether there is a time window for calibration before calibrating the frequency of the oscillation signal based on the calibration signal, if yes, calibrating the frequency of the oscillation signal based on the calibration signal, and if no, latching the calibration signal.

8. The method according to claim 7, wherein comparing the voltage signal with the first voltage and the second voltage, and outputting the comparison result signal comprises: outputting a first comparison result signal if the voltage signal is lower than the second voltage, outputting a second comparison result signal if the voltage signal is higher than the second voltage and lower than the first voltage, and outputting a third comparison result signal if the voltage signal is higher than the first voltage.

9. The method according to claim 8, wherein adjusting the calibration value based on the comparison result signal comprises: adding 1 to the calibration value if the first comparison result signal is outputted, keeping the calibration value unchanged if the second comparison result signal is outputted, and subtracting 1 from the calibration value if the third comparison result signal is outputted.

10. The method according to claim 7, wherein the time window for calibration is generated by counting the number of the oscillation signal.

11. The method according to claim 7, wherein converting frequency of the oscillation signal into a voltage signal comprises: converting the frequency of the oscillation signal into a digital signal; and converting the digital signal into the voltage signal.

* * * * *